US006303449B1

(12) United States Patent
Pan et al.

(10) Patent No.: US 6,303,449 B1
(45) Date of Patent: Oct. 16, 2001

(54) METHOD TO FORM SELF-ALIGNED ELEVATED SOURCE/DRAIN BY SELECTIVE REMOVAL OF GATE DIELECTRIC IN THE SOURCE/DRAIN REGION FOLLOWED BY POLY DEPOSITION AND CMP

(75) Inventors: Yang Pan; James Yong Meng Lee; Ying Keung Leung; Yelehanka Ramachandramurthy Pradeep; Jia Zhen Zheng, all of Singapore (SG); Lap Chan, San Francisco, CA (US); Elgin Kiok Boone Quek, Singapore (SG); Ravi Sundaresan, San Jose, CA (US)

(73) Assignee: Chartered Semiconductor Manufacturing Inc., Milpitas, CA (US)

( * ) Notice: Subject to any disclaimer, the term of this patent is extended or adjusted under 35 U.S.C. 154(b) by 0 days.

(21) Appl. No.: 09/713,835

(22) Filed: Nov. 16, 2000

(51) Int. Cl.[7] .................................................. H01L 21/336
(52) U.S. Cl. ........................................... 438/300; 438/305
(58) Field of Search ............................ 438/300, 305–306

(56) References Cited

U.S. PATENT DOCUMENTS

| | | | |
|---|---|---|---|
| 5,422,289 | 6/1995 | Pierce | 437/32 |
| 5,491,099 * | 2/1996 | Hsu | 438/302 |
| 5,804,846 | 9/1998 | Fuller | 257/252 |
| 5,897,357 | 4/1999 | Wu et al. | 438/300 |
| 5,915,183 | 6/1999 | Gambino et al. | 438/300 |
| 6,015,727 | 1/2000 | Wanlass | 438/218 |
| 6,133,098 * | 10/2000 | Ogura et al. | 438/267 |
| 6,214,670 * | 4/2001 | Shih et al. | 438/259 |

FOREIGN PATENT DOCUMENTS

| | | | |
|---|---|---|---|
| 6163572 * | 6/1994 | (JP) | H01L/21/8234 |

* cited by examiner

*Primary Examiner*—Charles Bowers
*Assistant Examiner*—Thanh Nguyen
(74) *Attorney, Agent, or Firm*—George O. Saile; Rosemary L. S. Pike; William J. Stoffel

(57) ABSTRACT

A method of manufacturing a self aligned elevated source/drain (S/D). A first insulating layer is formed over a substrate. The first insulating layer having at least a gate opening and source/drain (S/D) openings adjacent to the gate opening. Spacer portions of the first insulating layer define the gate opening. A gate dielectric layer is formed over the substrate in the gate opening. A conductive layer is formed over the substrate. The conductive layer fills the gate opening and the source/drain (S/D) openings. The conductive layer is doped with dopants. The conductive layer is planarized to form a gate over the gate dielectric layer and filling the gate opening and filling the source/drain (S/D) opening to form elevated source/drain (S/D) regions. The conductive layer is preferably planarized so that the top surface of the conductive layer is level with the top surface of the first insulating layer. The spacer portions are removed to form spacer openings. LDD regions are formed in the substrate in the spacer opening. A dielectric layer is formed over the substrate filling the spacer openings. Source/drain (S/D) regions are formed in the substrate under the elevated source/drain (S/D) regions.

11 Claims, 3 Drawing Sheets

50 50 26 20 10 24 42 22

54 82 56 52 26 20 n+ n- n- n+ 10 76 72 42 70 74

METHOD TO FORM SELF-ALIGNED ELEVATED SOURCE/DRAIN BY SELECTIVE REMOVAL OF GATE DIELECTRIC IN THE SOURCE/DRAIN REGION FOLLOWED BY POLY DEPOSITION AND CMP

BACKGROUND OF INVENTION

1) Field of the Invention

This invention relates generally to fabrication of MOS semiconductor device and more particularly to the fabrication of an elevated source/drain (S/D) for a field effect transistor.

2) Description of the Prior Art

In conventional CMOS processing, the active silicon regions are contacted through openings in the overlying oxide insulating layer. Metal used for forming electrical contacts must overlay these openings sufficiently to prevent damage to the active regions during patterning of the metal. Furthermore, the active source and drain regions must be large enough to accommodate misalignment during patterning. The dimensions of these active region result in large source/drain to substrate capacitances that seriously degrade the performance of the circuit. Furthermore, these conventional processing methods are unsuitable for fabricating devices of submicron size.

To overcome these problems, many schemes have been proposed to provide self-aligned source/drain contacts in submicron devices. These include various proposals for providing local interconnect layers, typically of TiN or polysilicon, to interface with a raised source and drain.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,804,846 (Fuller) that teaches a method for a self aligned elevated S/D by W layer and CMP.

U.S. Pat. No. 5,915,183 (Gambino et al.) shows a raised source/drain (S/D) process by a Poly etch.

U.S. Pat. No. 5,897,357 (Wu et al.) shows a process for a raised source/drain (S/D).

U.S. Pat. No. 5,422,289 (Pierce) shows another raised poly S/D process.

U.S. Pat. No. 6,015,727 (Wanlass) teaches a damascene S/D process.

However, the prior art process can be improved upon.

SUMMARY OF THE INVENTION

It is an object of the present invention to provide a method for fabricating an elevated source/drain (S/D).

It is an object of the present invention to provide a method for fabricating an elevated source/drain (S/D) that is more manufacturable than the prior art processes.

It is an object of the present invention to provide a method for fabricating a self aligned elevated source/drain (S/D) by the selective removal of gate dielectric in the source/drain region followed by poly deposition and chemical-mechanical polish (CMP).

It is an objective to provide a method to provide a shallow junction to minimize short Channel effects.

It is an objective to provide a method to provide a salicide process that does not cause junction leakage.

To accomplish the above objectives, the present invention provides a method of manufacturing a self aligned elevated source/drain (S/D). A first insulating layer is formed over a substrate. The first insulating layer has at least a gate opening and source/drain (S/D) openings adjacent to the gate opening. "Spacer portions" of the first insulating layer define the gate opening. A gate dielectric layer is formed over the substrate in the gate opening. A conductive layer is formed over the substrate. The conductive layer fills the gate opening and the source/drain (S/D) openings. The conductive layer is doped with dopants. The conductive layer is planarized to form a gate over the gate dielectric layer and filling the gate opening and filling the source/drain (S/D) opening to form elevated source/drain (S/D) regions. The conductive layer is preferably planarized so that the top surface of the conductive layer is level with the top surface of the first insulating layer. The spacer portions are removed to form spacer openings. LDD regions are formed in the substrate in the spacer opening. A dielectric layer is formed over the substrate filling the spacer openings. Source/drain (S/D) regions are formed in the substrate under the elevated source drain (S/D) regions.

The present invention's raised source drain proves many advantages over the prior art process. The invention's CMP to define the gate and raised source drain is more manufacturable and less costly than prior art processes.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

A preferred embodiment of the present invention is shown in FIGS. 1 to 7. The invention is a method for a self aligned elevated source/drain (S/D).

Figure 1:
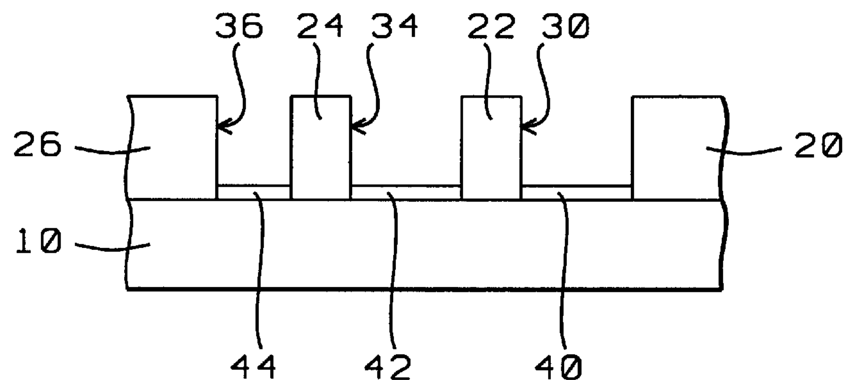
FIGS. 1 through 6 are cross sectional views for illustrating a method for manufacturing an elevated source/drain (S/D) according to the present invention.

As shown in FIG. 1, a first insulating layer is formed over a substrate 10. The first insulating layer 20 22 24 26 has at least a gate opening 34 and source/drain (S/D) openings 30 36 adjacent to the gate opening 34. Spacer portions 24 22 of the first insulating layer define the gate opening 34.

The first insulating layer preferably has a thickness of between about 1000 and 2000 Å.

As shown in FIG. 1, we form a gate dielectric layer 40 42 44 over the substrate 10.

Figure 2:
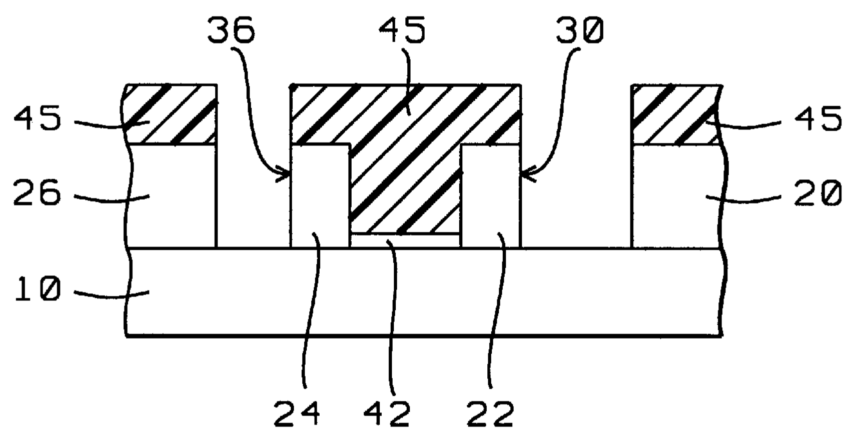

In a key step, as shown in FIG. 2, the gate dielectric layer is removed from the S/D openings leaving the gate dielectric layer 42 only over the substrate 10 in the gate opening 34. A mask 45 is formed with opening over the S/D openings 30 36. The gate dielectric layer is etched using the mask 45 as an etch mask to remove the gate dielectric from the S/D openings. The mask 45 is then removed.

The gate dielectric layer is preferably comprised of a silicon oxide and preferably has thickness of between about 10 and 60 Å.

Figure 3:
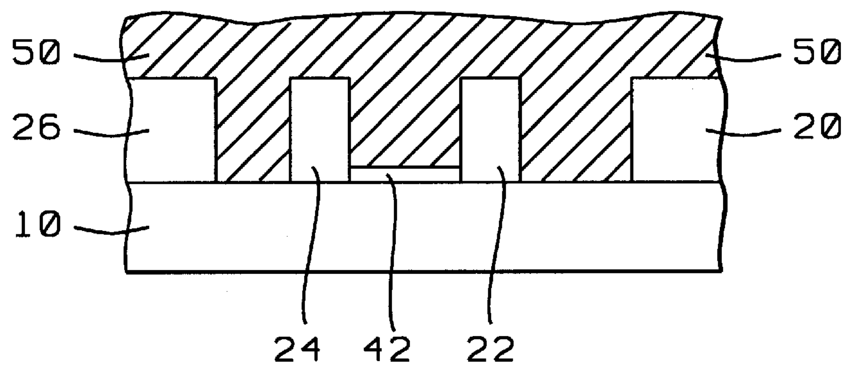

As shown in FIG. 3, we form a conductive layer 50 over the substrate 10. The conductive layer 50 fills the gate opening 34 and the source/drain (S/D) openings 30 36. Preferably the conductive layer is doped with dopants. The conductive layer is preferably doped with a n-type dopant with a concentration between 1E19 and 1E21 atoms/cm$^3$.

Figure 4:
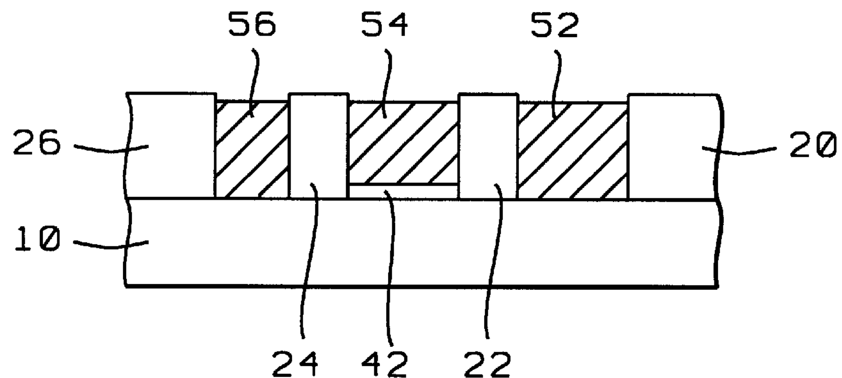

As shown in FIG. 4, we planarize the conductive layer 50 to form a gate 54 over the gate dielectric layer 42 and filling the gate opening 34 and filling the source/drain (S/D) opening 30 36 to form elevated source/drain (S/D) regions 52 56. The conductive layer is preferably planarized so that the top surface of the conductive layer is level with the top surface of the first insulating layer 20 22 24 26.

Figure 5:
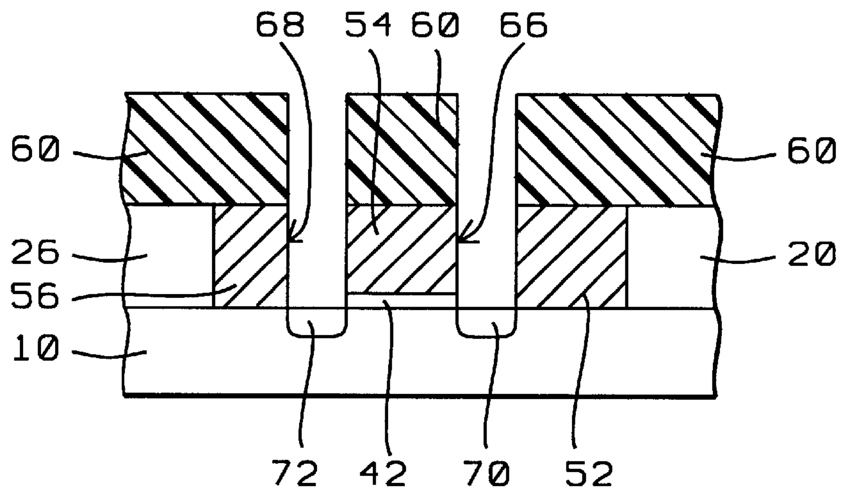

As shown in FIG. 5, we remove the spacer portions 24 22 to form spacer openings 64 66. The spacer portions 24 22 are preferably removed by forming a mask 60 having openings over the spacer portions 22 24. The spacer portions 24 22 are etching using the mask as an etch mask. The mask 60 is then removed.

Still referring to FIG. 5, we form LDD regions 70 72 in the substrate in the spacer opening 64 66. The LDD regions are preferably formed by implanting ions into said substrate through said spacer openings 64 66.

Figure 6:
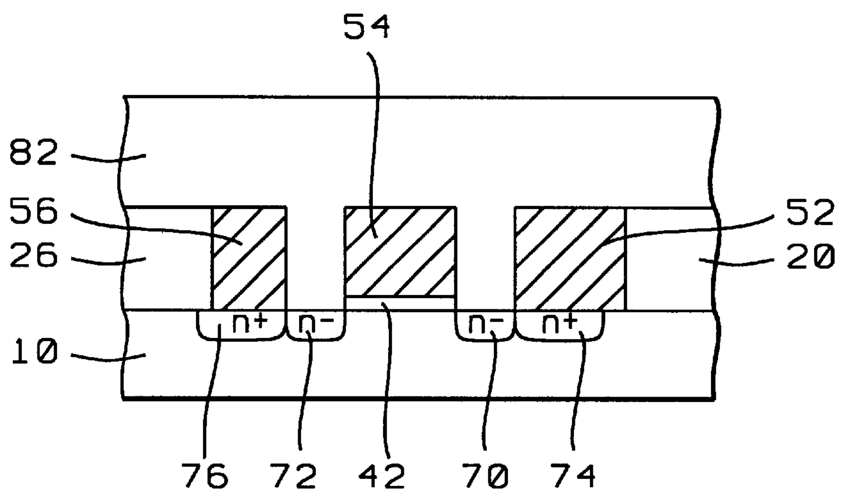
Figure 7:
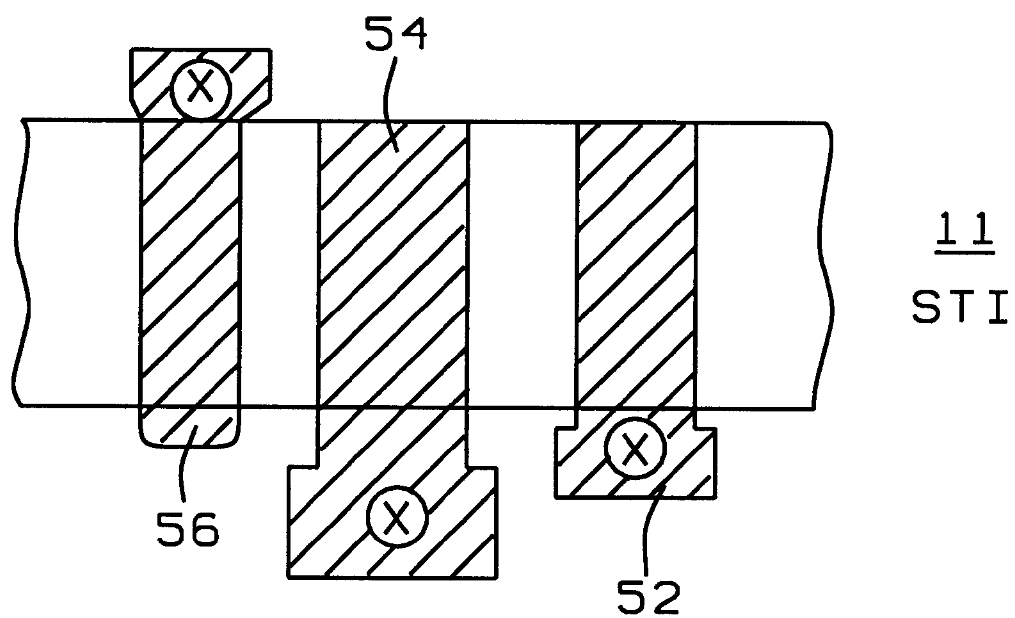
FIG. 7 is a top down view of a device for illustrating a method for manufacturing an elevated source/drain (S/D) according to the present invention.

As shown in FIG. 6, we form a dielectric layer 82 over the substrate filling the spacer openings 64 66. The dielectric layer is preferably composed of an oxide or a low K dielectric.

Still referring to FIG. 6, we form source/drain (S/D) regions 74 76 in the substrate under the elevated source/drain (S/D) regions 52 56. The source/drain (S/D) regions 74 76 preferably are fabricated by diffusing dopants from the elevated source/drain (S/D) regions 52 56 into the substrate 10. A heat cycle can diffuse the dopants. The heat cycle can be performed at any time.

The formation of the dielectric layer 82 and the source/drain (S/D) regions 74 76 can be performed in any order.

FIG. 8 shows a top down view of the device. Isolation (e.g., shallow trench isolation (STI)) 11 surround the active area 10. Gate 54, elevated Source and drain 54 are shown.

The method of the present invention employs silicon oxide dielectric materials to form the inter-level metal dielectric layer. Silicon oxide dielectric materials are deposited employing methods including but not limited to chemical vapor deposition (CVD) methods, plasma enhanced chemical vapor deposition (PECVD) methods, sub-atmospheric pressure thermal chemical vapor deposition (SACVD) methods, high pressure plasma chemical vapor deposition (HDP-CVD) methods, atmospheric pressure chemical vapor deposition (APCVD) methods and sputtering methods.

With respect to the substrate 10, the substrate 10 may be the substrate itself employed within a microelectronics fabrication selected from the group including but not limited to integrated circuit microelectronics fabrications, charge coupled device microelectronics fabrications, solar cell microelectronics fabrications, ceramics substrate microelectronics fabrications and flat panel display microelectronics fabrications. Alternatively, the substrate 10 may be any of several microelectronics layers formed upon a substrate employed within a microelectronics fabrication. The microelectronics layers employed within the microelectronics fabrication may include but are not limited to microelectronics conductor layers, microelectronics semiconductor layers and microelectronics dielectric layers.

Unless explicitly stated otherwise, each numerical value and range should be interpreted as being approximate as if the word about or approximately preceded the value of the value or range.

In the above description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention. Also, the flow rates in the specification can be scaled up or down keeping the same molar % or ratios to accommodate difference sized reactors as is known to those skilled in the art.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of fabrication of an elevated source/drain (S/D) region in a device; comprising the steps of:

a) forming first insulating layer over a substrate; said first insulating layer having at least a gate opening and source/drain (S/D) openings adjacent to said gate opening; spacer portions of said first insulating layer define said gate opening;

b) forming a gate dielectric layer over said substrate in said gate opening;

c) forming a conductive layer over said substrate; said conductive layer filling said gate opening and said source/drain (S/D) openings; said conductive layer is doped with dopants;

d) planarizing said conductive layer to form a gate over said gate dielectric layer and filling said gate opening and filling said source/drain (S/D) opening to form elevated source/drain (S/D) regions; said conductive layer is planarized so that the top surface of said conductive layer is level with the top surface of said first insulating layer;

e) removing said spacer portions to form spacer openings;

f) forming LDD regions in said substrate in said spacer opening;

g) forming a dielectric layer over said substrate filling said spacer openings; and h) forming source/drain (S/D) regions in said substrate under said elevated source/drain (S/D) regions.

2. The method of claim 1 wherein said first insulating layer having a thickness of between about 1000 and 2000 Å.

3. The method of claim 1 wherein said gate dielectric layer is comprised of a silicon oxide and has thickness of between about 10 and 60 Å.

4. The method of claim 1 wherein said conductive layer is doped with a n-type dopant with a concentration between 1E19 and 1E21 Atom/cc.

5. The method of claim 1 wherein said source/drain (S/D) regions fabricated by diffusing dopants from said elevated source/drain (S/D) regions into said substrate.

6. The method of claim 1 wherein the substrate is selected from the group consisting of:

microelectronics conductor materials;

microelectronics semiconductor materials; and microelectronics dielectric materials.

7. The method of claim 1 wherein said device is formed using microelectronics fabrication is selected from the group consisting of:

integrated circuit microelectronics fabrications;

charge coupled device microelectronics fabrications;

solar cell microelectronics fabrications;

ceramic substrate microelectronics fabrications; and flat panel display microelectronics fabrications.

8. A method of fabrication of an elevated source/drain (S/D) region; comprising the steps of:

a) forming first insulating layer over a substrate; said first insulating layer having at least a gate opening and source/drain (S/D) openings adjacent to said gate opening; spacer portions of said first insulating layer define said gate opening;

b) forming a gate dielectric layer over said substrate in said gate opening;

c) forming a conductive layer over said substrate; said conductive layer filling said gate opening and said source/drain (S/D) openings; said conductive layer is doped with dopants;

(1) said conductive layer is doped with a n-type dopant with a concentration between 1E19 and 1E21 Atom/cc;

d) planarizing said conductive layer to form a gate over said gate dielectric layer and filling said gate opening and filling said source/drain (S/D) opening to form elevated source/drain (S/D) regions; said conductive layer is planarized so that the top surface of said conductive layer is level with the top surface of said first insulating layer;

e) removing said spacer portions to form spacer openings;

f) forming LDD regions in said substrate in said spacer opening;

g) forming a dielectric layer over said substrate filling said spacer openings; and h) forming source/drain (S/D) regions in said substrate under said elevated source/drain (S/D) regions;

(1) said source/drain (S/D) regions fabricated by diffusing dopants from said elevated source/drain (S/D) regions into said substrate.

9. The method of claim 8 wherein said first insulating layer having a thickness of between about 1000 and 2000 Å.

10. The method of claim 8 wherein said gate dielectric layer is comprised of a silicon oxide and has thickness of between about 10 and 60 Å.

11. A method of fabrication of an elevated source/drain (S/D) region; comprising the steps of:

a) forming first insulating layer over a substrate; said first insulating layer having at least a gate opening and source/drain (S/D) openings adjacent to said gate opening; spacer portions of said first insulating layer define said gate opening;

(1) said first insulating layer having a thickness of between about 1000 and 2000 Å;

b) forming a gate dielectric layer over said substrate in said gate opening;

(1) said gate dielectric layer is comprised of a silicon oxide and has thickness of between about 10 and 60 Å;

c) forming a conductive layer over said substrate; said conductive layer filling said gate opening and said source/drain (S/D) openings; said conductive layer is doped with dopants;

(1) said conductive layer is doped with a n-type dopant with a concentration between 1E19 and 1E21 Atom/cc;

d) planarizing said conductive layer to form a gate over said gate dielectric layer and filling said gate opening and filling said source/drain (S/D) opening to form elevated source/drain (S/D) regions; said conductive layer is planarized so that the top surface of said conductive layer is level with the top surface of said first insulating layer;

e) removing said spacer portions to form spacer openings;

f) forming LDD regions in said substrate in said spacer opening;

g) forming a dielectric layer over said substrate filling said spacer openings; and h) forming source/drain (S/D) regions in said substrate under said elevated source/drain (S/D) regions;

(1) said source/drain (S/D) regions are fabricated by diffusing dopants from said elevated source/drain (S/D) regions into said substrate.

* * * * *